(12) United States Patent
Coudert

(10) Patent No.: US 11,023,635 B1
(45) Date of Patent: Jun. 1, 2021

(54) SEQUENCE OF FRAMES GENERATED BY EMULATION AND WAVEFORM RECONSTRUCTION USING THE SEQUENCE OF FRAMES

(71) Applicant: Synopsys, Inc., Mountain View, CA (US)

(72) Inventor: Olivier Coudert, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/940,251

(22) Filed: Jul. 27, 2020

(51) Int. Cl.
*G06F 30/331* (2020.01)
*G01R 31/3181* (2006.01)
*G01R 31/3177* (2006.01)

(52) U.S. Cl.
CPC ........ *G06F 30/331* (2020.01); *G01R 31/3177* (2013.01); *G01R 31/3181* (2013.01)

(58) Field of Classification Search
CPC ............ G01R 31/3177; G01R 31/3181; G06F 30/331
See application file for complete search history.

(56) References Cited

U.S. PATENT DOCUMENTS

| | | | | |
|---|---|---|---|---|
| 9,286,424 | B1 * | 3/2016 | Larzul | G06F 11/261 |
| 9,372,947 | B1 * | 6/2016 | Elmufdi | G06F 30/331 |
| 9,495,492 | B1 * | 11/2016 | Ramabadran | G06F 30/3312 |
| 2016/0328499 | A1 * | 11/2016 | Larzul | G06F 30/331 |
| 2018/0137031 | A1 * | 5/2018 | Jain | G06F 11/3652 |
| 2019/0005178 | A1 * | 1/2019 | Adaikalasamy | G06F 30/3312 |

* cited by examiner

*Primary Examiner* — Stacy Whitmore
(74) *Attorney, Agent, or Firm* — Patterson + Sheridan, LLP

(57) ABSTRACT

An example is a method. A design of an integrated circuit is loaded onto an emulation system and is emulated by the emulation system. A sequence of frames is captured, by the emulation system, from the emulation. The sequence of frames includes frame intervals, and each frame interval includes a full frame and a delta primary frame subsequent to the full frame. The full frame is captured at a respective sample time, and the full frame includes signals of the design or a change of the signals relative to a respective sample time of the full frame of a previous frame interval. The delta primary frame is captured at a respective sample time, and the delta primary frame includes a change of a subset of the signals relative to a respective sample time of a previous frame of the respective frame interval. The sequence of frames is stored to memory.

20 Claims, 7 Drawing Sheets

SEQUENCE OF FRAMES GENERATED BY EMULATION AND WAVEFORM RECONSTRUCTION USING THE SEQUENCE OF FRAMES

TECHNICAL FIELD

The present disclosure relates to functional verification of a design of an integrated circuit (IC), and more particularly, to capturing a sequence of frames during emulation of the design that can be used to reconstruct waveforms using the sequence of frames.

BACKGROUND

Emulators have been developed to assist circuit designers in designing and debugging highly complex integrated circuits. An emulator can include multiple programmable devices, such as field programmable gate arrays (FPGAs), that together can imitate the operations of a design of an integrated circuit, e.g., a design under test (DUT). By using an emulator to imitate the operations of a DUT, designers can verify, prior to fabrication, that a DUT functions as intended.

One aspect of emulation includes emulating a DUT and retrieving emulation results from the emulator. Emulation results can be analyzed to verify, for example, timing relationships and digital logic operations of the DUT. In one approach, emulation results are transferred to another system for performing analysis. For example, waveforms of the emulation results are generated at another system to graphically represent timing relationships and digital logic operations of the DUT. In advanced process nodes, a DUT may include billons of logic gates and signals. Emulating such a complex DUT can involve transferring an extremely large amount of data including states or values of billions of signals for a large number of clock cycles from the emulator to another system. This can place a significant strain on computing resources (e.g., processing resources, memory, bandwidth, and disk) as well as requiring large amounts of time to test a complex DUT.

SUMMARY

An example of the present disclosure is a method. A design of an integrated circuit is loaded onto an emulation system. The design of the integrated circuit is emulated by the emulation system. A sequence of frames is captured, by the emulation system, from the emulation of the design of the integrated circuit. The sequence of frames includes frame intervals, and each frame interval of the frame intervals includes a full frame and a delta primary frame subsequent to the full frame. The full frame is captured at a respective sample time, and the full frame includes signals of the design of the integrated circuit or a change of the signals relative to a respective sample time of the full frame of a previous frame interval. The delta primary frame is captured at a respective sample time, and the delta primary frame includes a change of a subset of the signals relative to a respective sample time of a previous frame of the respective frame interval. The sequence of frames is stored to memory.

In the above example method, the signals can include one or more of: (i) a signal input to the design of the integrated circuit, (ii) an output signal of memory or a black box element in the design of the integrated circuit, and (iii) an output signal of a sequential element in the design of the integrated circuit. Further, the subset of the signals can include one or more of: (i) the signal input to the design of the integrated circuit, and (ii) the output signal of the memory or the black box element in the design of the integrated circuit.

In the above example method, the signals can include (i) each signal input to the design of the integrated circuit, (ii) each output signal of each memory and each black box element in the design of the integrated circuit, and (iii) each output signal of each sequential element in the design of the integrated circuit. Further, the subset of the signals can consist of each signal input to the design of the integrated circuit and each output signal of each memory and each black box element in the design of the integrated circuit.

In the above example method, each frame interval of the sequence of frames can have a same predefined number of frames.

In the above example method, the frames of the sequence of frames can be sampled at respective sequential sample times during the emulation.

The above example method can also include reconstructing, by one or more processors, waveforms of the signals of the design of the integrated circuit based on the sequence of frames.

In the above example method, reconstructing the waveforms can include: obtaining the signals corresponding to a respective sample time from each full frame that captures the signals at the respective sample time from the emulation; obtaining the signals corresponding to a respective sample time based on each full frame that captures a change to the signals at the respective sample time from the emulation and the signals corresponding to the full frame of the respective previous frame interval; and obtaining, for each frame interval of the frame intervals, the subset of the signals corresponding to a respective sample time based on the delta primary frame captured at the respective sample time and the subset of the signals corresponding to the respective previous frame of the respective frame interval.

In the above example method, reconstructing the waveforms can include: obtaining the signals corresponding to respective sample times from a respective full frame of each frame interval of the frame intervals, and for each frame interval of the frame intervals and the delta primary frame within the respective frame interval captured at a respective sample time, obtaining the subset of the signals corresponding to the respective sample time using the subset of the signals corresponding to the respective previous frame of the respective frame interval and using the change to the subset of the signals captured by the respective delta primary frame. For each full frame that captures the signals at a respective sample time, the signals corresponding to the respective sample time can be obtained from the respective full frame. For each full frame that captures a change to the signals at a respective sample time, the signals corresponding to the respective sample time can be obtained using the signals corresponding to the full frame of the respective previous frame interval and using the change to the signals captured by the respective full frame.

In the above example method, reconstructing the waveforms of the signals can include processing the frame intervals of the sequence of frames in parallel.

Another example of the present disclosure is a system. The system includes a memory and one or more processors. The memory stores instructions. The one or more processors are coupled with the memory to execute the instructions. The instructions when executed cause the one or more processors to: obtain a design of an integrated circuit, and compile the design of the integrated circuit with trace logic into loadable data. The loadable data is loadable onto one or more programmable devices of an emulation system for emulating the design of the integrated circuit on the one or more programmable devices. The trace logic is configured to capture a sequence of frames during emulation of the design of the integrated circuit and store the sequence of frames to memory. The sequence of frames includes frame intervals, and each frame interval of the frame intervals includes a full frame and delta primary frames subsequent to the full frame. The full frame is captured at a respective sample time during the emulation, and the full frame includes signals of the design of the integrated circuit or a change of the signals relative to a respective sample time of the full frame of a previous frame interval. Each delta primary frame is captured at a respective sample time during the emulation, and each delta primary frame includes a change of a subset of the signals relative to a respective sample time of a previous frame of the respective frame interval.

In the above example system, the signals can include (i) each signal input to the design of the integrated circuit, (ii) each output signal of each memory and each black box element in the design of the integrated circuit, and (iii) each output signal of each sequential element in the design of the integrated circuit. Further, the subset of the signals can consist of each signal input to the design of the integrated circuit and each output signal of each memory and each black box element in the design of the integrated circuit.

In the above example system, each frame interval of the sequence of frames can have a same predefined number of frames.

In the above example system, the instructions that when executed can further cause the one or more processors to insert the trace logic into the design of the integrated circuit.

In the above example system, the one or more programmable devices can include one or more field programmable gate arrays.

Another example of the present disclosure is a system. The system includes a memory and one or more processors. The memory stores instructions. The one or more processors are coupled with the memory to execute the instructions. The instructions when executed cause the one or more processors to: obtain a sequence of frames stored in memory, and reconstruct waveforms of the signals of the design of the integrated circuit based on the sequence of frames. The sequence of frames is generated from emulation of a design of an integrated circuit. The sequence of frames includes frame intervals, and each frame interval of the frame intervals includes a full frame and delta primary frames subsequent to the full frame. The full frame is captured at a respective sample time during the emulation, and the full frame includes signals of the design of the integrated circuit or a change of the signals relative to a respective sample time of the full frame of a previous frame interval. Each delta primary frame is captured at a respective sample time during the emulation, and each delta primary frame includes a change of a subset of the signals relative to a respective sample time of a previous frame of the respective frame interval.

In the above example system, the instructions that when executed cause the one or more processors to reconstruct the waveforms can further cause the one or more processors to: obtain the signals corresponding to a respective sample time from each full frame that captures the signals at the respective sample time from the emulation; obtain the signals corresponding to a respective sample time based on each full frame that captures a change to the signals at the respective sample time from the emulation and the signals corresponding to the full frame of the respective previous frame interval; and obtain, for each frame interval of the frame intervals, the subset of the signals corresponding to a respective sample time based on each delta primary frame captured at the respective sample time and the subset of the signals corresponding to the respective previous frame of the respective frame interval.

In the above example system, the instructions that when executed cause the one or more processors to reconstruct the waveforms can further cause the one or more processors to: obtain the signals corresponding to respective sample times from a respective full frame of each frame interval of the frame intervals, and for each frame interval of the frame intervals and each delta primary frame within the respective frame interval captured at a respective sample time, obtain the subset of the signals corresponding to the respective sample time using the subset of the signals corresponding to the respective previous frame of the respective frame interval and using the change to the subset of the signals captured by the respective delta primary frame. For each full frame that captures the signals at a respective sample time, the signals corresponding to the respective sample time can be obtained from the respective full frame. For each full frame that captures a change to the signals at a respective sample time, the signals corresponding to the respective sample time can be obtained using the signals corresponding to the full frame of the respective previous frame interval and using the change to the signals captured by the respective full frame.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

DETAILED DESCRIPTION

Figure 1:
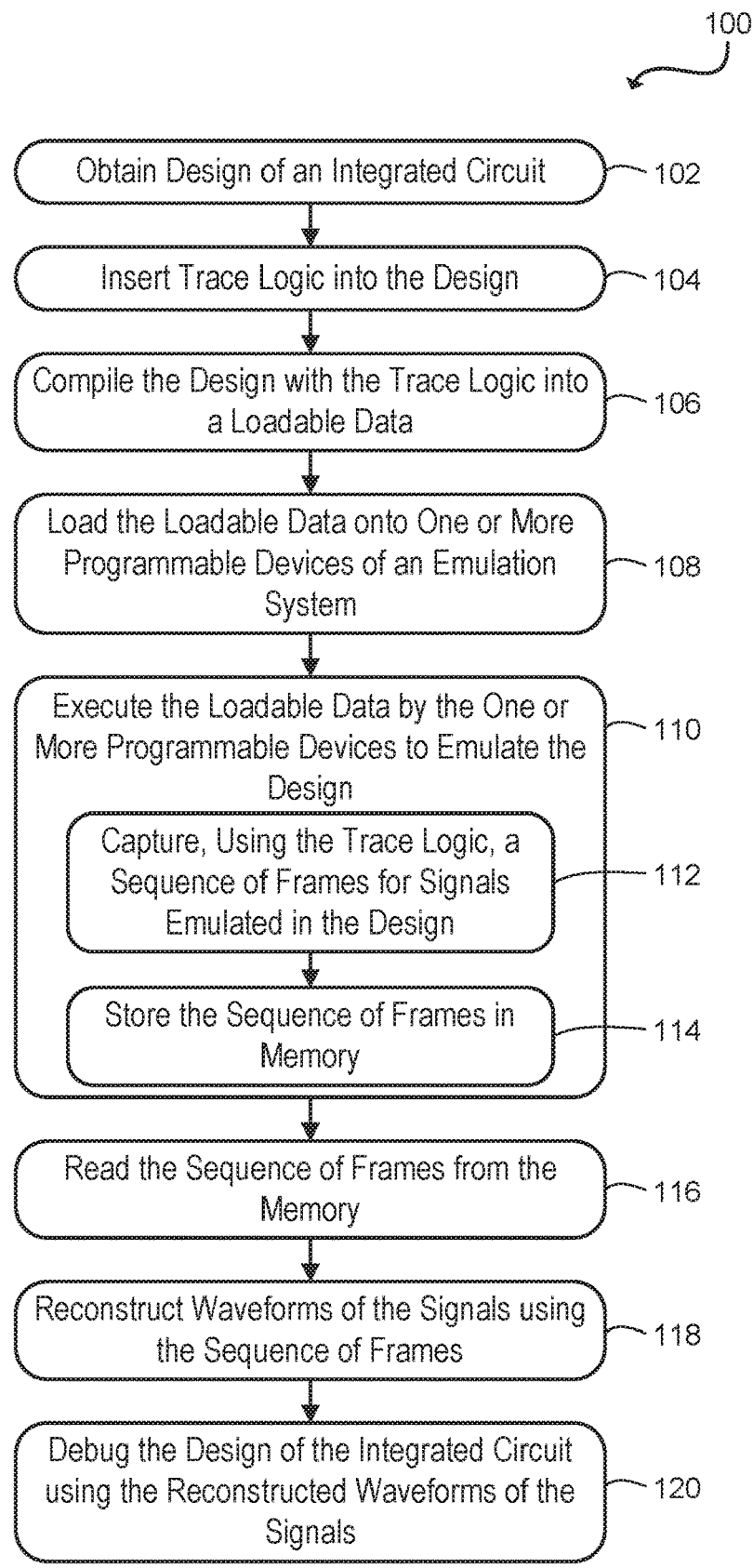
FIG. 1 is a flowchart of a method for verification of a design of an integrated circuit, in accordance with some examples of the present disclosure.

Aspects described herein relate to generating a sequence of frames by emulation and reconstructing waveforms using the sequence of frames. Generally, according to some examples, during emulation of a design of an integrated circuit, a sequence of frames having a specified format is captured. The sequence of frames can then be used to reconstruct waveforms of the signals during the emulation, which can be used to debug the design.

In a design process, a design of an integrated circuit can be emulated by an emulation system. Generally, the design, which can be referred to as a design under test (DUT), is obtained, and, if not present in the emulation system, trace logic is inserted into the design so that signals can be traced through the emulation. The design is synthesized, mapped, and/or compiled into a bit file that is to be loaded on the emulation system for emulation. The emulation system includes one or more programmable devices, such as a field programmable gate array (FPGA), programmable application specific IC (ASIC), and/or the like, on which the bit file can be loaded for emulation. The emulation system can execute the bit file that is loaded on the emulation system to emulate the design. The emulation of the design by the emulation system can capture a sequence of frames, as described in detail below. The captured signals can then be used to reconstruct waveforms that are simulated to have occurred during emulation of the design. The reconstructed waveforms can be used to show operation of the design, and a user can use the reconstructed waveforms to determine where a fault or defect may exist in the design.

A design can include sequential elements. Examples of such sequential elements include flip-flops, latches, and any other circuit that has a current output state that depends on the previous output state of that circuit. A sequential element may have a current state of its output signal that depends on a current state of one or more input signals and a previous state of its output signal.

A design can have a number of types of signals. One type is a primary signal. A primary signal generally cannot be reconstructed based on simulating operation of the design. A primary signal can be, for example, a random variable and/or may be a result of some unknown functionality. Examples of a primary signal include an input signal to the design from a source exterior to the design, an output signal of memory, and an output signal of a black box element (e.g., where the functionality is unknown) in the design. Another type of signals is a non-primary sequential signal. A non-primary sequential signal generally is an output signal of a sequential element in the design, which is dependent on a previous state of the sequential element. A non-primary sequential signal can generally be reconstructed based on a known (e.g., reconstructed) previous state of the respective sequential element, a known (e.g., reconstructed) signal(s) input to the respective sequential element, and operation of the design. Another type of signals is a non-primary combinatorial signal. A non-primary combinatorial signal generally is an output signal of a combinational element in the design. A combinational element generally is dependent on signals input to the combinational element and not on a previous state of the combinational element. A non-primary combinatorial signal can generally be reconstructed based on a known (e.g., reconstructed) signal(s) input to the respective combinatorial element and operation of the design.

Sequential elements and non-primary sequential signals can be a limitation to reconstructing waveforms of a design. To construct a waveform for a non-primary sequential signal, the input signal(s) and previous output state of the respective sequential element is obtained. In some implementations of an emulation system, input signals input to the design and respective output signals of sequential elements can be captured at each clock cycle. From these captured signals, the waveforms of each signal can be reconstructed. However, capturing these signals at each clock cycle can be a burden on resources of the emulation system, such as memory, bandwidth, and disk. The captured signals can be a large amount of data that can exceed the capacity of the memory in which the captured signals are stored. Further, capturing these signals can be time-intensive due to bandwidth limitations that may be present in the emulation system for storing the captured signals to external memory or disk.

In other implementations of an emulation system, input signals input to the design and/or subsequent changes to these signals, without output signals of sequential elements, can be captured at each clock cycle. The reduction in captured signals can mitigate limitations of memory and bandwidth of writing to memory; however, capturing these signals can cause an inability to process the signals in parallel in reconstructing the waveforms. Generally, a previous state(s) of a signal(s) at a previous clock cycle will have to be reconstructed (to reconstruct the previous output state) prior to reconstructing a current state of an output signal of a sequential element.

Examples described herein can mitigate these challenges by implementing the specified format of the sequence of frames. Each frame captures some signals of the design at a respective sequential sample time or changes of the signals at the respective sequential sample time relative to a previous sample time. The sequence of frames includes frame intervals, and each frame interval includes a full frame and subsequent delta primary frames.

A full frame can capture, at a respective sample time, signals of the design (e.g., as a full-full frame) or changes to the signals relative to a respective sample time of a previous full frame (e.g., as a delta-full frame). The signals can be or include primary signals and non-primary sequential signals. More specifically, the signals can be input signals input to the design from a source exterior to the design, output signals of memory and black box elements in the design, and output signals of sequential elements in the design.

Each delta primary frame can capture, at a respective sample time, a change to a subset of the signals (e.g., less than all of the signals captured by a full frame) relative to a sample time of a previous frame, which may be a full frame or a delta primary frame. The subset of the signals can be primary signals. More specifically, the subset of the signals can be the input signals input to the design from a source exterior to the design and the output signals of memory and black box elements in the design, and can, in some examples, exclude output signals of sequential elements in the design.

To debug the design, waveforms of the signals can be reconstructed using the sequence of frames. Signals corresponding to sample times of full frames are obtained. In some examples, an initial frame of the sequence of frames is a full-full frame. The signals (e.g., primary signals and non-primary sequential signals) at an initial sample time can be obtained from the full-full frame since the signals are captured by the full-full frame. Signals at respective sample time(s) for any other full-full frame(s) can likewise be obtained. For any delta-full frame, the signals (e.g., primary signals and non-primary sequential signals) at the respective sample time of the delta-full frame can be obtained using the signals obtained or generated from a previous full frame in the sequence of frames and using the changes to the signals captured at the respective sample time by the delta-full frame. For each delta primary frame, the subset of signals (e.g., primary signals) at the respective sample time of the delta primary frame can be obtained using the corresponding signals obtained or generated from a previous frame (e.g., a full frame or a delta primary frame) in the sequence of frames and using the changes to the subset of the signals captured at the respective sample time by the delta primary frame.

With the signals corresponding to sample times of frames of a given frame interval, signals of the design that were not already obtained can be simulated for the sample times. For example, with primary signals and non-primary sequential signals already obtained for a sample time corresponding to a full frame of the frame interval, other signals (e.g., non-primary combinatorial signals) can be simulated, by simulating the design using the previously obtained signals corresponding to the full frame, for the sample time corresponding to the full frame.

Then, signals of the design that were not already obtained and that correspond to sequential sample times of delta primary frames within the frame interval and subsequent to the full frame are obtained sequentially for the sample times. For example, with primary signals already obtained for a sample time corresponding to a delta primary frame immediately following the full frame in the frame interval, and with the non-primary sequential signals already obtained for the sample time of the full frame, other signals (e.g., non-primary sequential signals and non-primary combinatorial signals) can be simulated, by simulating the design using the previously obtained non-primary sequential signals corresponding to the full frame and the primary signals corresponding to the delta primary frame, for the sample time corresponding to the delta primary frame. Similarly, other signals (e.g., non-primary sequential signals and non-primary combinatorial signals) at respective sample times corresponding to subsequent delta primary frames can be simulated, by simulating the design using the previously simulated non-primary sequential signals corresponding to the sample time of the previous delta primary frame and the primary signals corresponding to the current delta primary frame, for the sample time corresponding to the current delta primary frame.

The signals obtained or generated that correspond to the various sample times can then be sequenced in order of the sample times (e.g., in order of increasing sequential sample times) to reconstruct the waveforms of the signals.

Examples described herein enable efficient use of resources, such as memory to capture signals during emulation and parallel processing to reconstruct waveforms. The sequence of frames, as briefly described above and detailed below, permits a reduction of data that is captured during emulation, which can alleviate bandwidth and usage of memory concerns. Additionally, the sequence of frames permits parallel processing to reconstruct waveforms, which can permit faster processing to obtain the reconstructed waveforms.

FIG. 1 is a flowchart of a method 100 for verification of a design of an integrated circuit, in accordance with some examples of the present disclosure. The method 100 is described below in the context of various figures to illustrate aspects. These figures are provided merely as examples, and a person having ordinary skill in the art will readily understand application of the method 100 in other examples.

As described in further detail below, the method 100, and any subset of operations therein, can be embodied by one or more sets of instructions, which may be one or more software modules, stored on a non-transitory computer readable medium. One or more processors of a computer system can be configured to read and execute the one or more sets of instructions, which causes the one or more processors to perform the various operations or steps of the method 100. In some examples, some operations or steps of the method 100 can be embodied as one or more sets of instructions as one or more software modules, and other operations or steps of the method 100 can be embodied as one or more other sets of instructions as one or more other software modules. The different software modules can be distributed and stored on different non-transitory computer readable media on different computer systems for execution by respective one or more processors of the different computer systems in some examples.

At 102, a design of an integrated circuit is obtained. The design can be in any format, such as a netlist, hardware description language (HDL) code, a register transfer level (RTL) description, or any other appropriate format. The design can be stored in memory of a computer system and may be obtained by reading the design from the memory.

At 104, trace logic is inserted into the design. The trace logic is configured to capture signals and changes to signals at sample times, package frames for a sequence of frames, and store the sequence of frames to memory. The trace logic can be or include any combinational and/or sequential logic configured to perform these operations. The trace logic can vary based on the signals and changes to signals that are to be captured for a given design and a structure of the sequence of frames that is to be implemented.

At 106, the design with the trace logic is compiled into loadable data. The loadable data can be a file that can be loaded onto one or more programmable devices of an emulation system to emulate the design. For example, the programmable devices can be FPGAs. With the programmable devices being FPGAs, compiling the design with the trace logic can include placing circuit elements of the design to programmable logic or other elements within an FPGA and routing interconnections between the circuit elements within the FGPA. Loadable data, e.g., a bit file, is generated from the placed and routed logic. At 108, the loadable data is loaded onto the one or more programmable devices of an emulation system. For example, the loadable data is stored to memory of the one or more programmable devices, from which the respective programmable device reads the loadable data to configure the programmable device.

A compiler can be embodied by one or more sets of instructions stored on a non-transitory computer readable medium, e.g., of a computer system. One or more processors of the computer system can be configured to read and execute the one or more sets of instructions, which causes the one or more processors to execute the compiler. The compiler can perform the operations of 102, 104, 106, and 108.

At 110, the loadable data is executed by the one or more programmable devices to emulate the design. For example, the programmable device can include a controller that reads the loadable data from memory and responsively programs the programmable elements (e.g., programmable logic or other elements) in the programmable device. The design is then executed by the programmable device as a result of the programmable device being programmed according to and executing the loadable data.

The execution of the loadable data at 110 includes capturing, using the trace logic inserted into the design, a sequence of frames for signals emulated in the design at 112 and storing the sequence of frames in memory at 114. The trace logic can be coupled to nets in the design such that the trace logic is configured to read signals on the nets. The trace logic is configured to capture the signals on the nets at sample times and to capture any change to those signals from one sample time to another. Whether the trace logic captures the signals or any change to those signals at any given sample time depends on where the sample time is in a sequence for capturing frames, as described in detail below with respect to FIG. 2. Additionally, which signals or changes thereto are captured depending on where the sample time is in a sequence for capturing frames, as also detailed below.

Figure 2:
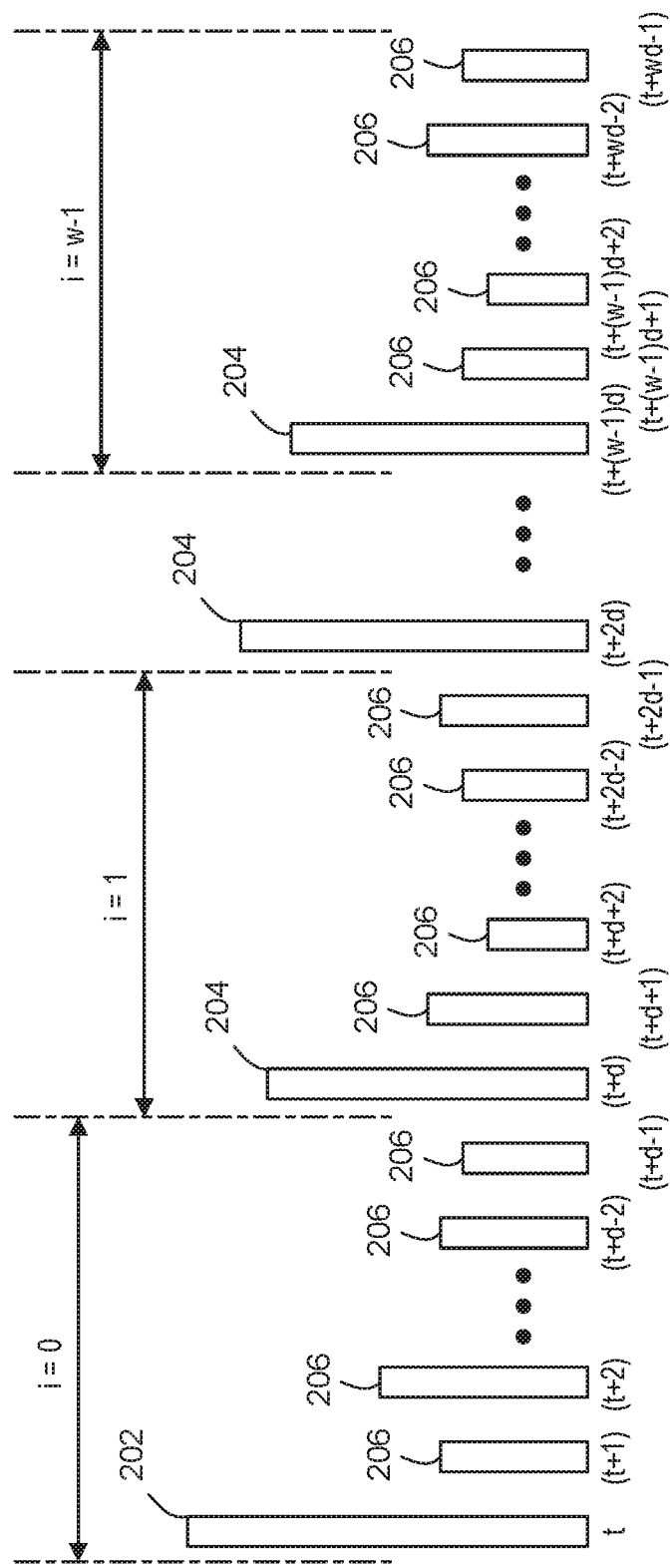
FIG. 2 illustrates a sequence of frames captured by trace logic executed by an emulation system during emulation, in accordance with examples of the present disclosure.

FIG. 2 illustrates a sequence of frames captured by trace logic executed by an emulation system during emulation, in accordance with examples of the present disclosure. The sequence includes w number (e.g., i=0, i=1, . . . 1=(w−1)) of frame intervals, where each frame interval includes d number (e.g., j=0, j=1, . . . j=(d−1)) of sampling cycles. In some examples, a sampling cycle is or corresponds to a clock cycle of the emulation system in which the design is emulated, and any sample time is a time corresponding to the sampling cycle at which various signals or changes in signals can be captured by the trace logic executed by the emulation system. The w number and d number can be arbitrary and/or based on system considerations or constraints of the emulation system, for example. In some examples, d can be selected to accommodate the bandwidth or on-board memory of a programmable device of an emulation system, or to reduce the overall time taken to reconstruct waveforms from the beginning of the emulation. In some examples, d can equal 128, can equal 2000, or can equal any number. Further, in some examples, the trace logic can capture, during emulation of the design, multiple sequences of frames, where each sequence has w*d number of frames. Each sequence can be processed independently of other sequences.

A sample time for a given sampling cycle j within frame interval i can be generalized as t+(i*d)+j, where t is an initial sample time of the sequence of frames, i is in a range from 0 to (w−1), and j is in a range from 0 to (d−1). Accordingly, the sequence of frames includes w*d sampling cycles and corresponding frames.

Each frame interval includes a full frame. A full frame can be a full-full frame or a delta-full frame, in some examples. A full-full frame captures signals at a given sample time. A delta-full frame captures changes to signals (e.g., the same signals captured by a full-full frame) at a given sample time relative to those signals at a sample time of a previous full frame. If no change in a signal occurs between the two sampling times, the delta-full frame may omit any data in the frame for that signal.

The signals that are captured by a full-full frame can be or include primary signals and non-primary sequential signals. The signals that are captured can include (i) input signals to the design of the integrated circuit (e.g., signals input to the design from a source exterior to the design of the integrated circuit), (ii) output signals of memory and any black box element (e.g., an element where the internal functionality is unknown) in the design, and (iii) output signals of sequential elements in the design. More specifically, the signals can include (i) each primary input signal to the design of the integrated circuit, (ii) each output signal of each memory and each black box element in the design, and (iii) each output signal of each sequential element in the design. The signals that are captured by a full-full frame can further include any other target signal on a net in the design.

In FIG. 2, a sequence initial frame 202 in the sequence of frames (e.g., in frame interval i=0) is a full-full frame. The sequence initial frame 202 is captured at the initial sampling cycle (e.g., j=0) of the initial frame interval (e.g., i=0), such that the sequence initial frame 202 is captured at sample time t. The sequence initial frame 202, being a full-full frame, captures signals at the sample time t.

In subsequent frame intervals, subsequent interval initial frames 204 in the sequence of frames are full frames that can be any of full-full frames, delta-full frames, or a combination of full-full frame(s) and delta-full frame(s). Each subsequent interval initial frame 204 is captured at the initial sampling cycle (e.g., j=0) of the respective subsequent frame interval (e.g., i>0) subsequent to the initial frame interval, such that the respective subsequent interval initial frame 204 is captured at sample time t+(i*d).

When a subsequent interval initial frame 204 is a full-full frame, that subsequent interval initial frame 204 captures the signals at sample time t+(i*d) that were captured by the sequence initial frame 202. When a subsequent interval initial frame 204 is a delta-full frame, that subsequent interval initial frame 204 captures at sample time t+(i*d) any change to the signals (that were captured by the sequence initial frame 202) relative to those signals at a sample time t+((i−x)*d) of a full frame (e.g., a full-full frame or a delta-full frame) of a previous frame interval, where x is an integer greater than or equal to 1.

For example, a delta-full frame for subsequent interval initial frame 204 at frame interval i=1 can capture changes to signals relative to the signals at the sample time t of the sequence initial frame 202 at frame interval i=0. Additionally, a delta-full frame for subsequent interval initial frame 204 at frame interval i=(w−1) can capture changes to signals relative to the signals at the sample time t+((w−2)*d) of the subsequent interval initial frame 204 at frame interval i=(w−2). In other examples, multiple subsequent interval initial frames 204 (e.g., each multiple subsequent interval initial frame 204 of the sequence of frames) are respective delta-full frames that capture at respective sample times t+(i*d) any change to the signals (that were captured by the sequence initial frame 202) relative to those signals at a sample time t of the sequence initial frame 202 or at a sample time of any other previous subsequent interval initial frames 204.

The sequence of frames further includes delta primary frames 206 within each frame interval at respective sample times following the full frame (e.g., the sequence initial frame 202 or subsequent interval initial frame 204) of the respective frame interval. A delta primary frame captures changes to a subset of the signals at a given sample time relative to those signals at a sample time of a previous full frame. If no change in a signal occurs between the two sampling times, the delta primary frame may omit any data in the frame for that signal.

The subset of the signals (changes to which are captured by delta primary frames 206) can be or include the primary signals. The subset of the signals can include (i) primary input signals to the design of the integrated circuit and (ii) output signals of memory and any black box element in the design. More specifically, the subset of the signals can include or consist of (i) each primary input signal to the design of the integrated circuit and (ii) each output signal of each memory and each black box element in the design. In some examples, the subset of the signals excludes or omits one or more signals of the signals that were captured by the sequence initial frame 202, such as the output signals of sequential elements in the design (e.g., non-primary sequential signals). In some examples, the subset of the signals has fewer signals than what were captured by the sequence initial frame 202. The subset of the signals can further include any other target signal on a net in the design.

Each delta primary frame 206 is captured at a respective sample time subsequent to the initial sample time of the respective frame interval. Within a frame interval i, delta primary frames 206 are captured at respective sample times $t+(i*d)+1$ to $t+(i*d)+(d-1)$. A delta primary frame 206 captures at sample time $t+(i*d)+j$ any change to a subset of the signals (that were captured by the sequence initial frame 202) relative to that subset of the signals at a sample time $t+(i*d)+(j-y)$ of a previous frame (e.g., a full frame or delta primary frame), where $(j-y)$ is an integer number greater than 0 and y is a positive integer.

For example, a delta primary frame 206 at sample time $(t+1)$ captures changes to the subset of the signals relative to that subset of the signals at the sample time t of the sequence initial frame 202. Additionally, a delta primary frame 206 at sample time $(t+2)$ can capture changes to the subset of the signals relative to that subset of the signals at the sample time $(t+1)$ of the delta primary frame 206. In other examples, the delta primary frames 206 within a frame interval (e.g., each delta primary frame 206 within a frame interval) capture at respective sample times $t+(i*d)+j$ any change to the subset of the signals relative to those signals at a sample time $t+(i*d)$ of the full frame of the frame interval or at a sample time of any other previous delta primary frame 206 of the frame interval.

The emulation system, while emulating the design, captures the sequence initial frame 202 at sample time t, the subsequent interval initial frames 204 at sample times $t+(i*d)$, and the delta primary frames 206 at other sample times using the trace logic (e.g., that is inserted in the design). The trace logic can capture appropriate signals or changes to appropriate signals, and package those signals in a frame. The trace logic then causes the packages of the frames to be stored in memory, as noted at 114 of FIG. 1. For example, if the design with the trace logic is loaded on programmable logic of one or more FPGAs, the trace logic can cause the frames to be stored in double data rate (DDR) dynamic random access memory (DRAM) off-chip from the respective chip of the FPGA. The format of the frames can be any format that can be subsequently read to reconstruct waveforms.

Referring back to FIG. 1, at 116, the sequence of frames is read from the memory. At 118, waveforms of the signals are reconstructed using the sequence of frames. Additionally, it is noted that many other signals that were not captured by the sequence of frames can be reconstructed by simulating the design using various signals and changes to signals indicated by frames of the sequence of frames. Such signals may be outputs of, e.g., only combinational logic that is dependent only on one or more of the primary signals.

Figure 3:
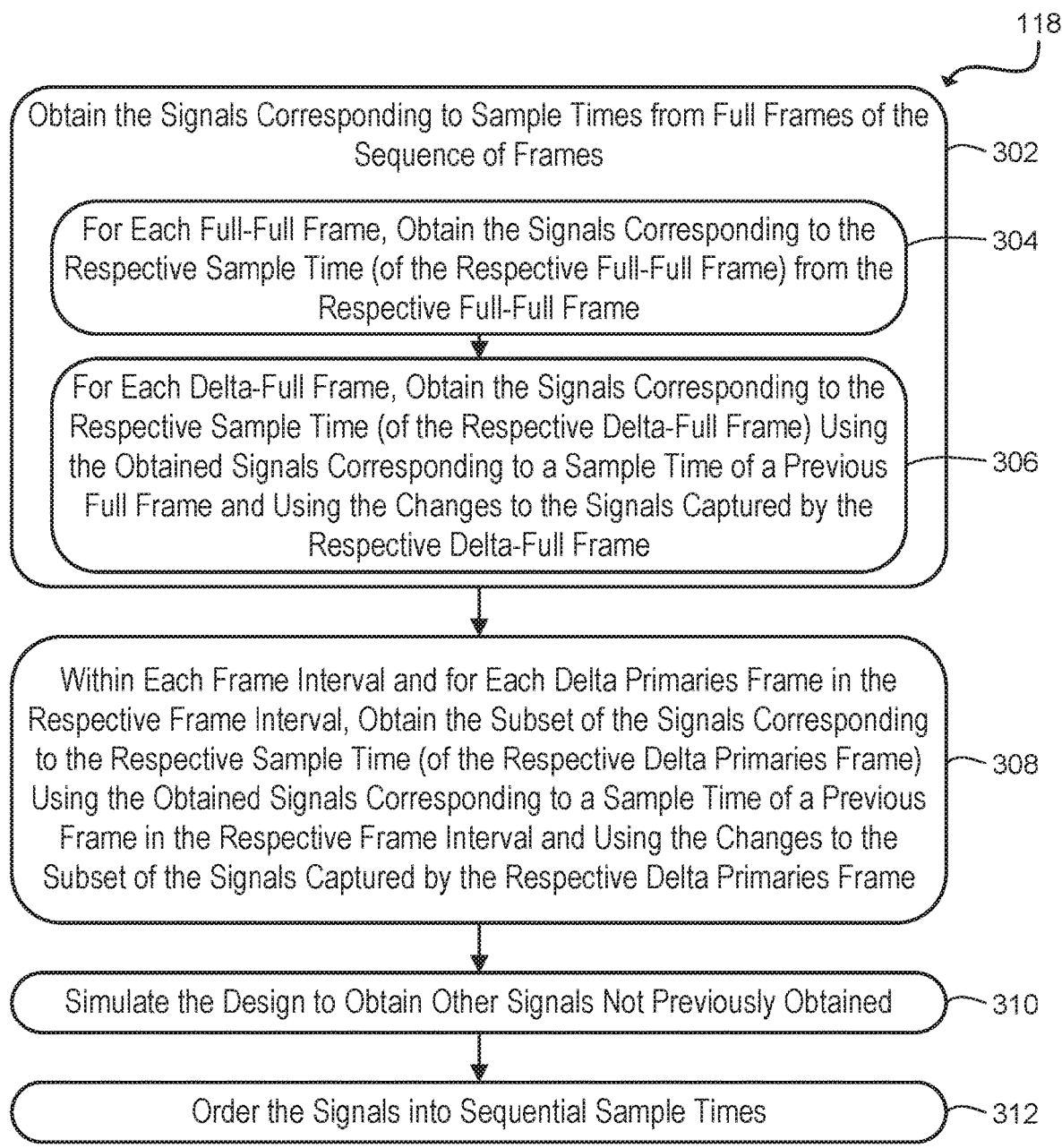
FIG. 3 illustrates example operations for reconstructing waveforms, in accordance with some examples of the present disclosure.
Figure 4:
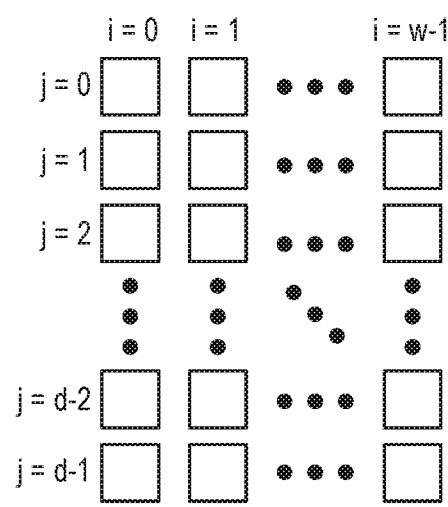
FIG. 4 illustrates aspects of logically reordering the frames as an array, in accordance with some examples of the present disclosure.

FIG. 3 illustrates example operations 118 for reconstructing waveforms, in accordance with some examples of the present disclosure. To reconstruct waveforms of signals from the sequence of frames, the sequence of frames can be logically reordered. FIG. 4 illustrates aspects of logically reordering the frames as an array, in accordance with some examples of the present disclosure, which is described in conjunction with FIG. 3. In FIG. 4, the array of nodes is arranged in columns and rows. Each column is associated with a given frame interval i. Each row is associated with a given sampling cycle j within a given frame interval i. Different logical structures can be implemented.

At 302 of FIG. 3, the signals corresponding to sample times from full frames of the sequence of frames are obtained. The obtaining of signals at 302 includes, for each full-full frame, obtaining the signals corresponding to the respective sample time (of the respective full-full frame) from the respective full-full frame at 304. Since full-full frames capture the signals, the signals corresponding to the sample times of such full-full frames can be directly obtained from the full-full frames.

The obtaining of signals at 302 further includes, for each delta-full frame, obtaining the signals corresponding to the respective sample time of the respective delta-full frame using the obtained signals corresponding to a previous sample time of a previous full frame and using the changes to the signals captured by the respective delta-full frame at 306. The previous sample time of the previous full frame that is used is determined based on the structure of the sequence of frames. The previous sample time of the previous full frame corresponds to the sample time from which changes to signals are captured by the delta-full frame.

As will be illustrated below, since a current state of the signals is known by, e.g., first obtaining the signals corresponding to the sample time of a previous full frame, changes to those signals captured by the delta-full frames can be applied to the known signals to obtain the signals corresponding to the sample times of the delta-full frames. In some examples, obtaining the signals at 302 obtains the primary signals and the non-primary sequential signals corresponding to sample times of the full frames of the sequence of frames.

With reference to FIG. 4 and in conjunction with 302 of FIG. 3, the full frames in the sequence of frames are used to populate the corresponding nodes of the array in row j=0 with the signals. In some examples, the signals for the sequence initial frame 202 are obtained as captured by the frame, where the sequence initial frame 202 is the full frame for frame interval i=0, and sequentially, the signals for the subsequent interval initial frame 204 are obtained for each subsequent frame interval i>0 (e.g., for frame interval i=1; then, for frame interval i=2; . . . then, for frame interval i=(w−1)).

For any full-full frame (e.g., the sequence initial frame 202), a simulator populates the corresponding node (i,0) in the array with the signals captured by the full-full frame. In some examples, the primary signals and the non-primary sequential signals populate the corresponding node (i,0) based on the full-full frame. As an example, node (0,0) is populated with the signals captured by the sequence initial frame 202.

For a delta-full frame, the simulator applies changes to signals captured by the delta-full frame to the signals of a node corresponding to a previous full frame to obtain the signals corresponding to the delta-full frame, and populates the corresponding node (i,0) in the array with the obtained signals. If the delta-full frame captures a value change, the signal corresponding to the delta-full frame takes that value applied to the corresponding signal of the previous full frame; otherwise, if the delta-full frame does not capture a value change, the signal corresponding to the delta-full frame takes the value of the corresponding signal of the previous full frame. In some examples, the full frame to which changes captured by a delta-full frame are applied is the sequence initial frame 202 in frame interval i=0, and in other examples, the full frame to which changes captured by a delta-full frame in frame interval i are applied is the full frame in the immediately preceding frame interval (i−1), which can depend of the format of the sequence of frames as captured. In some examples, the primary signals and the non-primary sequential signals populate the corresponding node (i,0) based on applying the changes captured by the delta-full frame and the corresponding primary and non-primary sequential signals of a node corresponding to a previous full frame.

For example, assuming that each subsequent interval initial frame 204 is a delta-full frame that captures changes to signals relative to a sample time of an immediately preceding full frame, the signals for a node (1,0) corresponding to the subsequent interval initial frame 204 in frame interval i=1 are obtained by applying the changes to signals captured by the subsequent interval initial frame 204 in frame interval i=1 to the signals from the node (0,0) (e.g., corresponding to the sequence initial frame 202), and that node (1,0) is populated with the obtained signals. Similarly, and, e.g., subsequently, the signals for a node (2,0) corresponding to the subsequent interval initial frame 204 in frame interval i=2 are obtained by applying the changes to signals captured by the subsequent interval initial frame 204 in frame interval i=2 to the signals from the node (1,0), and that node (2,0) is populated with the obtained signals.

For another example, assuming that each subsequent interval initial frame 204 is a delta-full frame that captures changes to signals relative to the sample time t of the sequence initial frame 202, the signals for a node (1,0) corresponding to the subsequent interval initial frame 204 in frame interval i=1 are obtained by applying the changes to signals captured by the subsequent interval initial frame 204 in frame interval i=1 to the signals from the node (0,0) (e.g., corresponding to the sequence initial frame 202), and that node (1,0) is populated with the obtained signals. Similarly, the signals for a node (2,0) corresponding to the subsequent interval initial frame 204 in frame interval i=2 are obtained by applying the changes to signals captured by the subsequent interval initial frame 204 in frame interval i=2 to the signals from the node (0,0), and that node (2,0) is populated with the obtained signals.

Referring back to FIG. 3, at 308, within each frame interval and for each delta primary frame in the respective frame interval, the subset of the signals corresponding to the respective sample time of the respective delta primary frame is obtained using the obtained signals corresponding to a previous sample time of a previous frame in the respective frame interval and using the changes to the subset of the signals captured by the respective delta primary frame. The previous sample time of the previous frame that is used is determined based on the structure of the sequence of frames. The previous sample time of the previous frame corresponds to the sample time from which changes to signals are captured by the delta primary frame.

As will be illustrated below, since a current state of the subset of the signals is known by, e.g., first obtaining the signals corresponding to the sample time of the full frame of a given frame interval, the changes to the subset of signals captured by the delta primary frames can be applied to the known state of the subset of the signals to obtain the subset of the signals corresponding to the sample times of the delta primary frames. For example, a change to a primary signal captured by a delta primary frame can be applied to the known state of that primary signal as obtained from, e.g., the full frame of the frame interval as described above with respect to 302.

With reference to FIG. 4 and in conjunction with 308 of FIG. 3, with the signals obtained for each node in the row j=0 (e.g., corresponding to the full frames of the sequence of frames), the nodes corresponding to delta primary frames 206 within each column can be populated with the subset of the signals. With the signals having been obtained for each node in the row j=0 as described above, each column of nodes in the array can be processed independently such that the columns of the array may be processed in parallel. Processing the columns of the array in parallel can permit the waveform reconstruction to be performed faster, e.g., approaching w times faster compared to sequentially processing all nodes.

For a delta primary frame 206, the simulator, starting with the signals of the node (i,0) in the respective column, sequentially applies the changes to the subset of the signals captured by sequential delta primary frames 206 in the respective column. The simulator populates the corresponding node (i,j) in the array with the subset of the signals obtained by applying the changes to the subset of the signals of a corresponding delta primary frame 206. In some examples, the primary signals populate the corresponding node (i,j) based on applying the changes of the primary signals captured by the corresponding delta primary frame to the obtained primary signals corresponding to a previous frame.

For example, assuming that each delta primary frame 206 captures changes to signals relative to a sample time of an immediately preceding frame, the subset of the signals for a node (0,1) corresponding to the delta primary frame 206 in frame interval i=0 at sampling cycle j=1 are obtained by starting with the signals from the node (0,0) (e.g., corresponding to the sequence initial frame 202) and applying thereto the changes to the subset of the signals captured by the delta primary frame 206 in frame interval i=0 at sampling cycle j=1, and that node (0,1) is populated with the obtained subset of the signals. Similarly, the subset of the signals for a node (0,2) corresponding to the delta primary frame 206 in frame interval i=0 at sampling cycle j=2 are obtained by starting with the signals from the node (0,1) and applying thereto the changes to the subset of the signals captured by the delta primary frame 206 in frame interval i=0 at sampling cycle j=2, and that node (0,2) is populated with the obtained subset of the signals. Nodes of different columns can be similarly be obtained, where the subset of the signals for a node (i,j>0) corresponding to a delta primary frame 206 in frame interval i at sampling cycle j are obtained by starting with the signals from the node (i,(j−1)) and applying thereto the changes to the subset of the signals captured by the delta primary frame 206 in frame interval i at sampling cycle j, and that node (i,j>0) is populated with the obtained subset of the signals.

For another example, assuming that each delta primary frame 206 captures changes to signals relative to a sample time of the full frame (e.g., the sequence initial frame 202 or subsequent interval initial frame 204) of the frame interval, the subset of the signals for a node (0,1) corresponding to the delta primary frame 206 in frame interval i=0 at sampling cycle j=1 are obtained by starting with the signals from the node (0,0) (e.g., corresponding to the sequence initial frame 202) and applying thereto the changes to the subset of the signals captured by the delta primary frame 206 in frame interval i=0 at sampling cycle j=1, and that node (0,1) is populated with the obtained subset of the signals. Similarly, the subset of the signals for a node (0,2) corresponding to the delta primary frame 206 in frame interval i=0 at sampling cycle j=2 are obtained by starting with the signals from the node (0,0) and applying thereto the changes to the subset of the signals captured by the delta primary frame 206 in frame interval i=0 at sampling cycle j=2, and that node (0,2) is populated with the obtained subset of the signals. Nodes of different columns can be similarly be obtained, where the subset of the signals for a node (i,j>0) corresponding to a delta primary frame 206 in frame interval i at sampling cycle j are obtained by starting with the signals from the node (i,0) and applying thereto the changes to the subset of the signals captured by the delta primary frame 206 in frame interval i at sampling cycle j, and that node (i,j>0) is populated with the obtained subset of the signals.

Referring back to FIG. 3, at 310, other signals not previously obtained are obtained by simulating the design. The signals corresponding to sample times of differing frame intervals can be simulated in parallel in some examples. The simulation can obtain (i) non-primary sequential signals corresponding to sample times where the non-primary sequential signals have not been obtained (e.g., sample times corresponding to delta primary frames) and (ii) non-primary combinatorial signals.

At a sample time corresponding to a full frame, in some examples, the primary signals and the non-primary sequential signals of that sample time are known, and the design is simulated using the known primary signals and non-primary sequential signals to obtain non-primary combinatorial signals of that sample time. Then, in those examples, sequentially for sample times corresponding to respective delta primary frames, the primary signals of the respective sample time are known from the respective delta primary frame and the non-primary sequential signals of a preceding sample time are known from a preceding full frame or delta primary frame, and the design is simulated using the known primary signals of the respective sample time and the non-primary sequential signals of the preceding sample time to obtain non-primary sequential signals and non-primary combinatorial signals of the respective sample time.

With reference to FIG. 4, for example, the signals that populate node (0,0) (e.g., primary signals and non-primary sequential signals) are used in a simulation of the design to obtain other signals (e.g., non-primary combinatorial signals) that were not previously obtained and that correspond to a sample time t. Then, the subset of signals (e.g., primary signals) that populate node (0,1) and another subset of the signals (e.g., non-primary sequential signals) that populate node (0,0) are used in the simulation of the design to obtain other signals (e.g., non-primary sequential signals and non-primary combinatorial signals) that were not previously obtained and that correspond to a sample time t+1. Then, the subset of signals (e.g., primary signals) that populate node (0,2) and another subset of the signals (e.g., non-primary sequential signals) that are associated with node (0,1) (e.g., which were obtained by a previous simulation) are used in the simulation of the design to obtain other signals (e.g., non-primary sequential signals and non-primary combinatorial signals) that were not previously obtained and that correspond to a sample time t+2. Signals of subsequent sampling times can likewise be obtained.

Generally, once nodes of row j=0 are populated (e.g., with primary signals and non-primary sequential signals) as described with respect to 302 of FIG. 3, and the row j=0 is simulated for non-primary combinatorial signals, then, the primary signals obtained from delta primary frames (e.g., node in rows j>0, and in columns i=0, . . . , w−1) can be used in a sequential simulation to reconstruct all the signals for the nodes in rows j>0. Each column can be reconstructed by independent simulation. Therefore, the columns can be processed in parallel (w columns in parallel), for example, using bit-wise computation. (d−1) number of sequential simulation passes can be used to compute the signals for the nodes in a column, and if the columns are processed in parallel, the (d−1) number of sequential simulation passes can populate the nodes in rows j>0.

Referring back to FIG. 3, at 312, the signals are ordered into sequential sample times to form the reconstructed waveforms of the signals. In the example of FIG. 4, the signals associated with the nodes are ordered first by column and then by row to form the reconstructed waveforms. For example, the ordering of the signals associated with the nodes, is in increasing sequential sample time, [(0,0), (0,1), (0,2), . . . (1,0), (1,1), . . . (w−1,d−1)]. This orders the signals associated with the nodes in a sequence that corresponds to the sequence of the frames and the sample times at which various signals or changes to signals were captured.

A simulator can be embodied by one or more sets of instructions stored on a non-transitory computer readable medium, e.g., of a computer system. One or more processors of the computer system can be configured to read and execute the one or more sets of instructions, which causes the one or more processors to execute the simulator. The simulator can perform the operations of 116 and 118. The simulation used by the simulator and at 118 to obtain the signals, in some examples, is a bitwise logical simulation or any other appropriate simulation.

Practically, bitwise operations can be performed in one clock cycle or a very small number of clock cycles, which can usually be performed using native registers of the computer system. With current technology, the native registers can be 128 bits, such that w can equal 128 in some examples. It is contemplated that processors of computer systems in the future will be able to operate on 256 bits or greater in some examples, at which time w can equal 256 or greater. Hence, greater benefits can be obtained from advancing processor architecture in future computer systems without significantly changing a simulator.

Referring back to FIG. 1, at 120, the design of the integrated circuit is debugged using the reconstructed waveforms of the signals. For example, a debugger with a viewer can display the reconstructed waveforms. Based on an analysis of the viewed reconstructed waveforms in the viewer, if the waveforms are not as expected or desired based on the intended design, a user can modify or debug the design, e.g., by changing connections, inserting functional blocks, deleting functional blocks, etc. If modified, the design can be verified by performing method 100 again.

A debugger with a viewer can be embodied by one or more sets of instructions stored on a non-transitory computer readable medium, e.g., of a computer system. One or more processors of the computer system can be configured to read and execute the one or more sets of instructions, which causes the one or more processors to execute the debugger with a viewer. The debugger with a viewer can perform the operation of 120.

Figure 5:
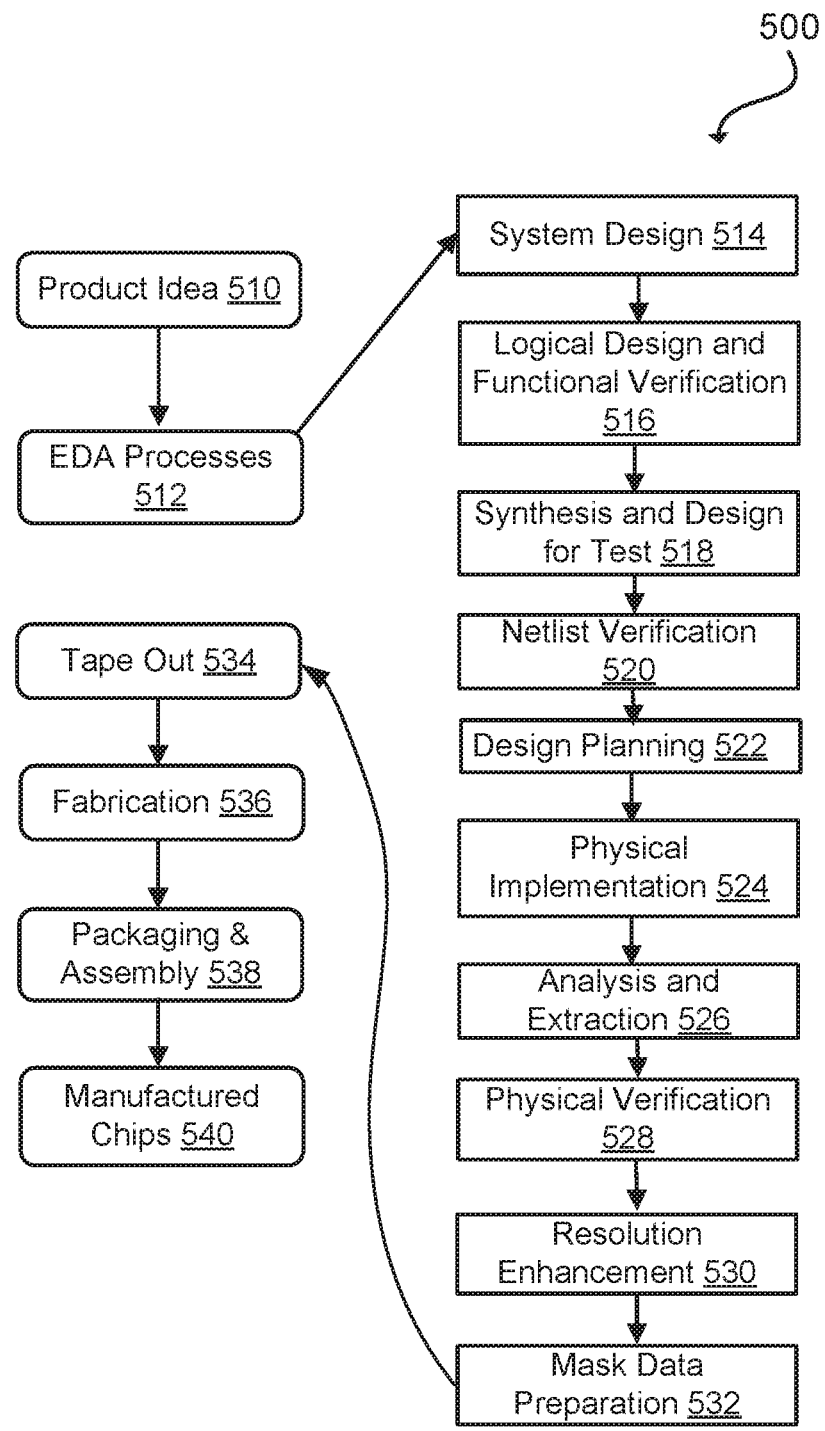
FIG. 5 depicts a flowchart of various processes used during the design and manufacture of an integrated circuit, in accordance with some examples of the present disclosure.

FIG. 5 illustrates an example set of processes 500 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 510, with the creation of a product idea with information supplied by a designer, information that is transformed to create an integrated circuit that uses a set of EDA processes, at block 512. When the design is finalized, the design is taped-out, at block 534, which is when artwork (e.g., geometric patterns) for the integrated circuit is sent to a fabrication facility to manufacture the mask set, which is then used to manufacture the integrated circuit. After tape-out, at block 536, the integrated circuit is fabricated on a semiconductor die, and at block 538, packaging and assembly processes are performed to produce, at block 540, the finished integrated circuit (oftentimes, also referred to as "chip" or "integrated circuit chip").

Specifications for a circuit or electronic structure may range from low-level transistor material layouts to high-level description languages. A high-level of abstraction may be used to design circuits and systems, using HDL such as VHDL, Verilog, SystemVerilog, SystemC, MyHDL or OpenVera. The HDL description can be transformed to a logic-level register transfer level (RTL) description, a gate-level description, a layout-level description, or a mask-level description. Each lower abstraction level that is a less abstract description adds more useful detail into the design description, such as, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 5. The processes described may be enabled by EDA products (or tools).

During system design, at block 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, such as an emulation system, are used to speed up the functional verification. The method 100 of FIG. 1 can be implemented in the logic design and functional verification of block 516 in some examples.

During synthesis and design for test, at block 518, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 520, the netlist is checked for compliance with timing constraints and for correspondence with the HDL code. During design planning, at block 522, an overall floor plan for the integrated circuit is constructed and analyzed for timing and top-level routing.

During layout or physical implementation, at block 524, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 526, the circuit function is verified at the layout level, which permits refinement of the layout design. During physical verification, at block 528, the layout design is checked to ensure that manufacturing constraints are correct, such as design rule check (DRC) constraints, electrical constraints, lithographic constraints, and that circuitry function matches the HDL design specification. During resolution enhancement, at block 530, the geometry of the layout is transformed to improve how the circuit design is manufactured.

During tape-out, data is created to be used (after lithographic enhancements are applied if appropriate) for production of lithography masks. During mask data preparation, at block 532, the tape-out data is used to produce lithography masks that are used to produce finished integrated circuits.

A storage subsystem of a computer system (such as computer system 700 of FIG. 7, or computer systems 604, 606, 608 of FIG. 6) may be used to store the programs and data structures that are used by some or all of the EDA products described herein, and products used for development of cells for the library and for physical and logical design that use the library.

Figure 6:
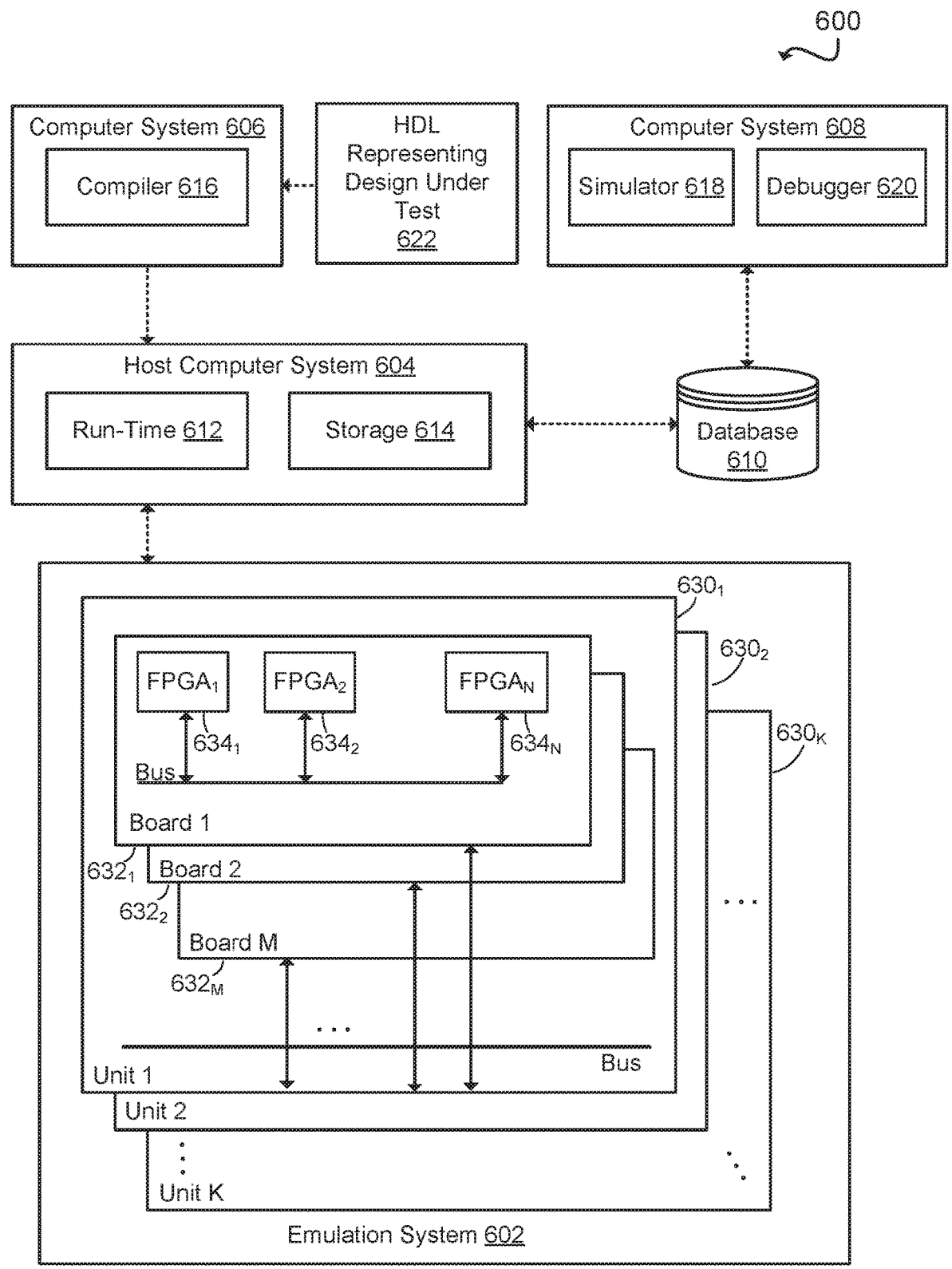
FIG. 6 depicts an abstract diagram of an example emulation environment, in accordance with some examples of the present disclosure.

FIG. 6 depicts an abstract diagram of an example design environment 600. The design environment 600, as illustrated, includes an emulation system 602 (e.g., a set of programmable devices, such as FPGAs, programmable ASICs, or processors), a host computer system 604, computer systems 606, 608, and a database 610. The emulation system 602 is configured or configurable to verify the functionality of a design of an integrated circuit. In the illustrated example, the emulation system 602 is FPGA-based, and in other examples, an emulation system can be based on other technologies (e.g., programmable processors, programmable ASICs, etc.) or a combination of technologies.

The host computer system 604 includes a run-time module 612 and a storage sub-system 614. The computer system 606 includes a compiler 616, and the computer system 608 includes a simulator 618 and a debugger 620. Each of the run-time module 612, compiler 616, simulator 618, and debugger 620 can be embodied by one or more sets of instructions stored on a non-transitory computer readable medium of the respective host computer system 604, computer system 606, and computer system 608. One or more processors of the respective host computer system 604, computer system 606, and computer system 608 can be configured to read and execute the one or more sets of instructions, which causes the one or more processors to execute the respective run-time module 612, compiler 616, simulator 618, and debugger 620. The various sub-systems of the host computer system 604 can be structured and enabled as individual or multiple modules, or two or more may be structured as a module. Although illustrated on the different computer systems 604, 606, 608, the run-time module 612, compiler 616, simulator 618, and debugger 620 can be implemented on one computer system or on any number of computer systems, and/or each can be executed in parallel on different computer systems and/or in parallel by different processors within one or more computer systems.

The database 610 can be any appropriate storage medium. For example, the database 610 can be implemented as a computer system, such as a server, with a non-transitory computer readable medium.

The computer systems 604, 606, 608 and database 610 are illustrated as being communicatively connected, as described in additional detail below. The various communicative connections can be implemented directly between the respective connected systems or through a network, such as a local area network (LAN), a wide area network (WAN) (e.g., the Internet), or any other network. The communicative connections can include wired and/or wireless connections.

The emulation system 602 includes one or more emulation units $630_1, 630_2, \ldots 630_K$. Each emulation unit $630_1$-$630_K$ includes one or more boards $632_1, 632_2, \ldots 632_M$. Each board $632_1$-$632_M$ includes one or more FPGAs $634_1, 634_2, \ldots 634_N$. The boards $632_1$-$632_M$ within an emulation unit $630_1$-$630_K$ can be connected using the backplane of the emulation unit $630_1$-$630_K$ or any other types of connections. Multiple emulation units (e.g., emulation units $630_1$-$630_K$) can be connected to each other by cables or any other means to form a multi-emulation unit system.

Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulation system 602 may include FPGAs, examples of emulation systems can include other types of logic blocks instead of, or along with, the FPGAs for emulating DUTs. For example, the emulation system 602 can include custom FPGAs, specialized ASICs for emulation or prototyping, memories, and input/output devices.

A programmable device, such as an FPGA, can include an array of programmable logic blocks and a hierarchy of interconnections that can enable the programmable logic blocks to be interconnected according to the descriptions in the HDL code. Each of the programmable logic blocks can enable complex combinational functions or enable logic gates, such as AND, and XOR logic blocks. In some examples, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

The host computer system 604 and emulation system 602 exchange data and information using signals carried by an emulation connection. The connection can include or be one or more electrical cables, such as cables with pin structures compatible with the Peripheral Component Interconnect express (PCIe), Recommended Standard 232 (RS232), or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host computer system 604 and emulation system 602 can exchange data through a third device such as a network server.

The computer system 606 receives a description of a DUT 622 that is to be emulated, like at 102 in FIG. 1. In some examples, the DUT description is in a description language (e.g., HDL, RTL, etc.). In some examples, the DUT description is in netlist level files or a mix of netlist level files and HDL files. If part of the DUT description or the entire DUT description is in an HDL, then the compiler 616 can synthesize the DUT description to create a gate level netlist using the DUT description. The compiler 616 can use the netlist of the DUT to partition the DUT into multiple partitions. The compiler 616 can insert trace logic into the DUT, like at 104 in FIG. 1. If the DUT is partitioned into multiple partitions, one or more of the partitions can include the trace logic. The trace logic can be configured to capture signals or changes to signals in the DUT that are on nets to which the trace logic is coupled, can package the signals or changes into frames, and can store the frames in memory, like in 112 and 114 of FIG. 1. The compiler 616 maps each partition to an FPGA of the emulation system 602. In some examples, the trace logic is included in select partitions for a group of FPGAs.

The compiler 616 on the computer system 606 creates bit files, like in 106 of FIG. 1, describing each partition of the DUT and the mapping of the partitions to the FPGAs. For partitions in which trace logic is included, the bit files also describe the trace logic that is included. The bit files can be based on place and route information and design constraints.

The compiler 616 may include sub-systems such as, but not limited to, a design synthesizer sub-system and a mapping sub-system. The design synthesizer sub-system transforms the HDL that represents a DUT 622 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into FPGAs of the emulation system 602. The mapping sub-system partitions a DUT at the gate level into a number of partitions using the netlist of the DUT. For each partition, the mapping sub-system retrieves a gate level description of the trace logic and adds the logic to the partition. The trace logic can be added to the DUT prior to the partitioning. For example, the trace logic can be added by the design synthesizer sub-system prior to or after the synthesizing the HDL of the DUT. The mapping sub-system maps each partition of the DUT to an FPGA of the emulation system 602. For partitioning and mapping, the mapping sub-system uses design rules, design constraints (e.g., timing or logic constraints), and information about the emulation system 602. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulation system 602. The mapping sub-system can generate a bit file for each partition of the DUT and can store the bit file in the storage sub-system.

The compiler 616 can store the bit files in storage of the computer system 606 and transmits the bit files to the host computer system 604. The run-time module 612 of the host computer system 604 receives the bit files, and upon request, the host computer system 604 (e.g., the run-time module 612) transmits the bit files to the emulation system 602, like in 108 of FIG. 1. The run-time module 612 signals the emulation system 602 to start the emulation of the DUT. The programmable devices (e.g., FPGAs) of the emulation system load the bit files and begin executing the bit files to emulate the DUT, like in 110 of FIG. 1. This execution includes capturing and storing the sequence of frames by the trace logic, like in 112 and 114 of FIG. 1.

During emulation of the DUT or at the end of the emulation, the run-time module 612 receives emulation results from the emulation system 602 through the emulation connection. Emulation results are data generated by the emulation system 602 during the emulation of the DUT, which include the sequence of frames that have been traced by the trace logic of each FPGA. For example, the run-time module 612 can read the results, including the sequence of frames, from the emulation system 602. The run-time module 612 can store the emulation results, e.g., in a database 610 and/or can transmit the emulation results to another computer system.

The run-time module 612 controls emulations performed by the emulation system 602. The run-time module 612 can cause the emulation system 602 to start or stop executing an emulation. Additionally, the run-time module 612 can provide input signals and data to the emulation system 602. The input signals can be provided directly to the emulation system 602 through the connection or indirectly through other input signal devices. For example, the run-time module 612 can control an input signal device to provide the input signals to the emulation system 602. The input signal device can be, for example, a test board (directly or through cables), signal generator, another emulation system, or another host system.

The simulator 618 on the computer system 608 can read the emulation results from storage (e.g., from the database 610), like at 116 of FIG. 1, and processes the emulation results. During emulation and/or after completing the emulation, the simulator 618 receives emulation results generated during the emulation. The simulator 618 reconstructs waveforms using the sequence of frames, like described above with respect to 118 of FIG. 1. The simulator 618 can store reconstructed waveforms in the storage of the computer system 608 and/or in other systems, like the database 610.

The debugger 620 on the computer system 608 allows circuit designers to view reconstructed waveforms and debug DUT components), like at 120 of FIG. 1. If a circuit designer requests to view a waveform of a signal, the debugger 620 retrieves the reconstructed signal from the storage of the computer system 608 or another system (e.g., the database 610). A viewer of the debugger 620 displays a plot of the reconstructed signal. A circuit designer can redesign a DUT using the debugger 620 and can request to debug a component of the DUT by re-emulating a component.

Figure 7:
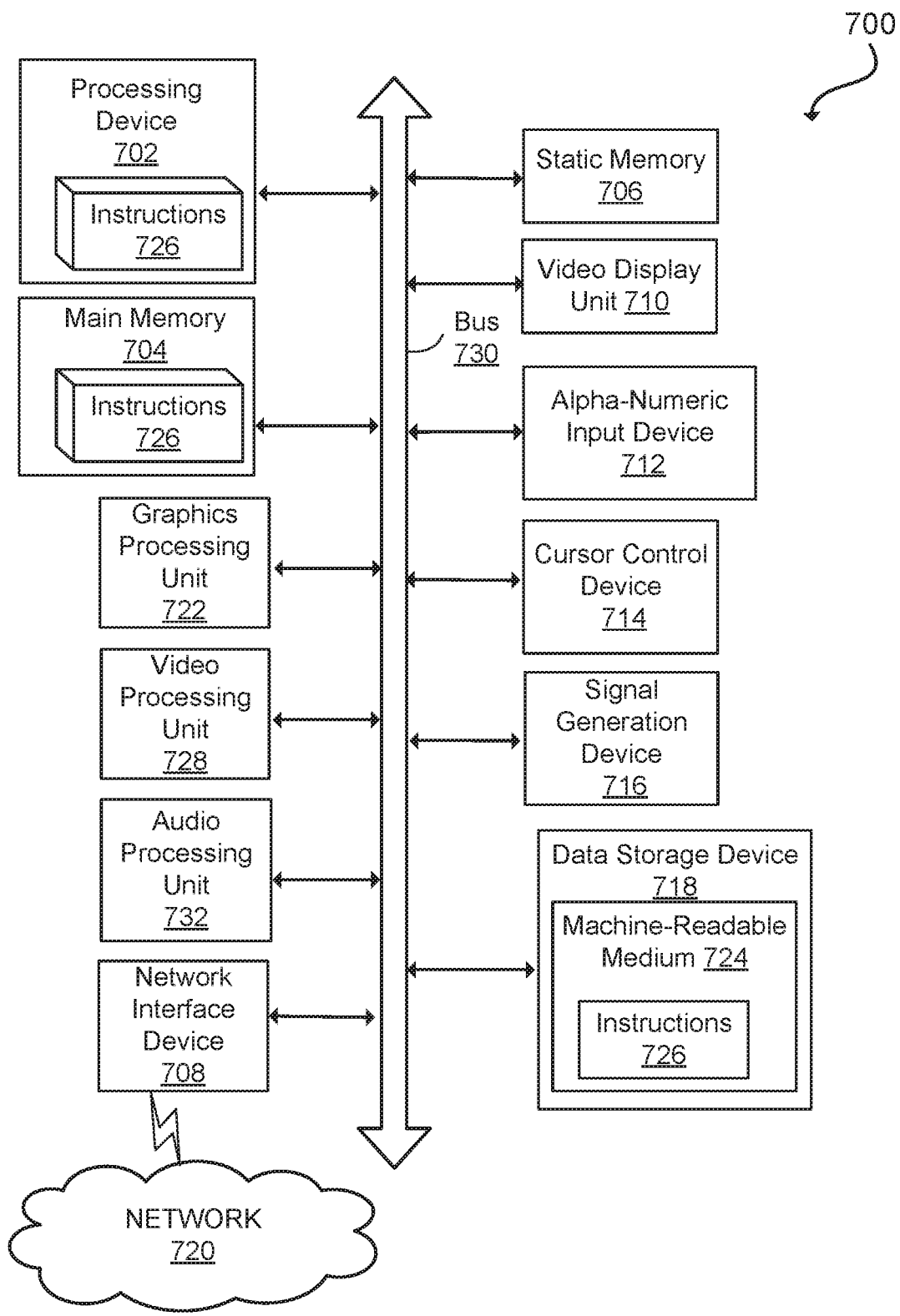
FIG. 7 depicts an abstract diagram of an example computer system in which examples of the present disclosure may operate.

FIG. 7 illustrates an example of a computer system 700 within which a set of instructions, for causing the computer system to perform any one or more of the methodologies or operations or steps of a portion of any methodology discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730. The main memory 704 includes or is a non-transitory computer readable medium. The main memory 704 (e.g., a non-transitory computer readable medium) can store one or more sets of instructions 726, that when executed by the processing device 702, cause the processing device 702 to perform some or all of the operations, steps, methods, and processes described herein.

Processing device 702 represents one or more processors such as a microprocessor, a central processing unit, or the like. More particularly, the processing device 702 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 702 may also be one or more special-purpose processing devices such as an ASIC, an FPGA, a digital signal processor (DSP), network processor, or the like. The processing device 702 may be configured to execute instructions 726 for performing some or all of the operations, steps, methods, and processes described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (e.g., a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also including machine-readable storage media.

In some implementations, the instructions 726 include instructions to implement functionality described above. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 702 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   loading a design of an integrated circuit onto an emulation system;
   emulating the design of the integrated circuit by the emulation system;
   capturing, by the emulation system, a sequence of frames from the emulation of the design of the integrated circuit, the sequence of frames including frame intervals, each frame interval of the frame intervals including a full frame and a delta primary frame subsequent to the full frame, wherein:
      the full frame is captured at a respective sample time, the full frame including signals of the design of the integrated circuit or a change of the signals relative to a respective sample time of the full frame of a previous frame interval, and
      the delta primary frame is captured at a respective sample time, the delta primary frame including a change of a subset of the signals relative to a respective sample time of a previous frame of the respective frame interval; and
   storing the sequence of frames to memory.

2. The method of claim 1, wherein the signals include one or more of: (i) a signal input to the design of the integrated circuit, (ii) an output signal of memory or a black box element in the design of the integrated circuit, and (iii) an output signal of a sequential element in the design of the integrated circuit.

3. The method of claim 2, wherein the subset of the signals includes one or more of: (i) the signal input to the design of the integrated circuit, and (ii) the output signal of the memory or the black box element in the design of the integrated circuit.

4. The method of claim 1, wherein the signals include (i) each signal input to the design of the integrated circuit, (ii) each output signal of each memory and each black box element in the design of the integrated circuit, and (iii) each output signal of each sequential element in the design of the integrated circuit.

5. The method of claim 4, wherein the subset of the signals consists of each signal input to the design of the integrated circuit and each output signal of each memory and each black box element in the design of the integrated circuit.

6. The method of claim 1, wherein each frame interval of the sequence of frames has a same predefined number of frames.

7. The method of claim 1, wherein the frames of the sequence of frames are sampled at respective sequential sample times during the emulation.

8. The method of claim 1 further comprising reconstructing, by one or more processors, waveforms of the signals of the design of the integrated circuit based on the sequence of frames.

9. The method of claim 8, wherein reconstructing the waveforms comprises:
 obtaining the signals corresponding to a respective sample time from each full frame that captures the signals at the respective sample time from the emulation;
 obtaining the signals corresponding to a respective sample time based on each full frame that captures a change to the signals at the respective sample time from the emulation and the signals corresponding to the full frame of the respective previous frame interval; and
 obtaining, for each frame interval of the frame intervals, the subset of the signals corresponding to a respective sample time based on the delta primary frame captured at the respective sample time and the subset of the signals corresponding to the respective previous frame of the respective frame interval.

10. The method of claim 8, wherein reconstructing the waveforms comprises:
 obtaining the signals corresponding to respective sample times from a respective full frame of each frame interval of the frame intervals, wherein:
  for each full frame that captures the signals at a respective sample time, the signals corresponding to the respective sample time are obtained from the respective full frame; and
  for each full frame that captures a change to the signals at a respective sample time, the signals corresponding to the respective sample time are obtained using the signals corresponding to the full frame of the respective previous frame interval and using the change to the signals captured by the respective full frame; and
 for each frame interval of the frame intervals and the delta primary frame within the respective frame interval captured at a respective sample time, obtaining the subset of the signals corresponding to the respective sample time using the subset of the signals corresponding to the respective previous frame of the respective frame interval and using the change to the subset of the signals captured by the respective delta primary frame.

11. The method of claim 8, wherein reconstructing the waveforms of the signals comprises processing the frame intervals of the sequence of frames in parallel.

12. A system comprising:
 a memory storing instructions; and
 one or more processors, coupled with the memory and to execute the instructions, the instructions when executed cause the one or more processors to:
  obtain a design of an integrated circuit; and
  compile the design of the integrated circuit with trace logic into loadable data, the loadable data being loadable onto one or more programmable devices of an emulation system for emulating the design of the integrated circuit on the one or more programmable devices, the trace logic being configured to capture a sequence of frames during emulation of the design of the integrated circuit and store the sequence of frames to memory, the sequence of frames including frame intervals, each frame interval of the frame intervals including a full frame and delta primary frames subsequent to the full frame, wherein:
   the full frame is captured at a respective sample time during the emulation, the full frame including signals of the design of the integrated circuit or a change of the signals relative to a respective sample time of the full frame of a previous frame interval, and
   each delta primary frame is captured at a respective sample time during the emulation, each delta primary frame including a change of a subset of the signals relative to a respective sample time of a previous frame of the respective frame interval.

13. The system of claim 12, wherein the signals include (i) each signal input to the design of the integrated circuit, (ii) each output signal of each memory and each black box element in the design of the integrated circuit, and (iii) each output signal of each sequential element in the design of the integrated circuit.

14. The system of claim 13, wherein the subset of the signals consists of each signal input to the design of the integrated circuit and each output signal of each memory and each black box element in the design of the integrated circuit.

15. The system of claim 12, wherein each frame interval of the sequence of frames has a same predefined number of frames.

16. The system of claim 12, wherein the instructions when executed further cause the one or more processors to insert the trace logic into the design of the integrated circuit.

17. The system of claim 12, wherein the one or more programmable devices include one or more field programmable gate arrays.

18. A system comprising:
 a memory storing instructions; and
 one or more processors, coupled with the memory and to execute the instructions, the instructions when executed cause the one or more processors to:
  obtain a sequence of frames stored in memory, the sequence of frames being generated from emulation of a design of an integrated circuit, the sequence of frames including frame intervals, each frame interval of the frame intervals including a full frame and delta primary frames subsequent to the full frame, wherein:
   the full frame is captured at a respective sample time during the emulation, the full frame including signals of the design of the integrated circuit or a change of the signals relative to a respective sample time of the full frame of a previous frame interval, and
   each delta primary frame is captured at a respective sample time during the emulation, each delta primary frame including a change of a subset of the signals relative to a respective sample time of a previous frame of the respective frame interval; and
  reconstruct waveforms of the signals of the design of the integrated circuit based on the sequence of frames.

19. The system of claim 18, wherein the instructions when executed cause the one or more processors to reconstruct the waveforms further cause the one or more processors to:
- obtain the signals corresponding to a respective sample time from each full frame that captures the signals at the respective sample time from the emulation;
- obtain the signals corresponding to a respective sample time based on each full frame that captures a change to the signals at the respective sample time from the emulation and the signals corresponding to the full frame of the respective previous frame interval; and
- obtain, for each frame interval of the frame intervals, the subset of the signals corresponding to a respective sample time based on each delta primary frame captured at the respective sample time and the subset of the signals corresponding to the respective previous frame of the respective frame interval.

20. The system of claim 18, wherein the instructions when executed cause the one or more processors to reconstruct the waveforms further cause the one or more processors to:
- obtain the signals corresponding to respective sample times from a respective full frame of each frame interval of the frame intervals, wherein:
  - for each full frame that captures the signals at a respective sample time, the signals corresponding to the respective sample time are obtained from the respective full frame; and
  - for each full frame that captures a change to the signals at a respective sample time, the signals corresponding to the respective sample time are obtained using the signals corresponding to the full frame of the respective previous frame interval and using the change to the signals captured by the respective full frame; and
- for each frame interval of the frame intervals and each delta primary frame within the respective frame interval captured at a respective sample time, obtain the subset of the signals corresponding to the respective sample time using the subset of the signals corresponding to the respective previous frame of the respective frame interval and using the change to the subset of the signals captured by the respective delta primary frame.

\* \* \* \* \*